United States Patent [19]
Hanke et al.

[11] Patent Number: 4,970,408
[45] Date of Patent: Nov. 13, 1990

[54] CMOS POWER-ON RESET CIRCUIT

[75] Inventors: Carl C. Hanke, Mesa; Carlos D. Obregon, Tempe; Timothy W. Sutton, Mesa, all of Ariz.

[73] Assignee: Motorola, Inc., Schaumburg

[21] Appl. No.: 428,678

[22] Filed: Oct. 30, 1989

[51] Int. Cl.$^5$ .................... H03K 17/20; H03K 17/22; H03K 17/284; H03K 17/687
[52] U.S. Cl. ............... 307/272.3; 307/296.5; 307/594; 307/597
[58] Field of Search ............... 307/272.3, 296.8, 296.2, 307/496, 362, 576, 579, 268, 279, 272.1, 594, 597, 592, 603, 296.5

[56] References Cited
U.S. PATENT DOCUMENTS
3,895,239  7/1975  Alaspa ........................... 307/272.3
4,812,679  3/1989  Mahabadi ....................... 307/272.3

Primary Examiner—Stanley D. Miller
Attorney, Agent, or Firm—Robert D. Atkins

[57] ABSTRACT

The output signal of a CMOS power-on reset circuit changes state upon detecting a predetermined threshold of the power supply voltage during the start-up transient. During the power-up of the power supply voltage, the output signal of the power-on reset circuit ramps up with the power supply voltage until the latter reaches a first predetermined level whereat a control signal begins to track the increasing power supply voltage, less two diodes potentials. Upon reaching the turn-on potential of a transistor, the control signal activates an inverter to substantially reduce the output signal signifying that the power supply voltage level is sufficient for the operation of external circuitry. The output signal then disables the current flowing through the power-on reset circuit to save power consumption.

18 Claims, 1 Drawing Sheet

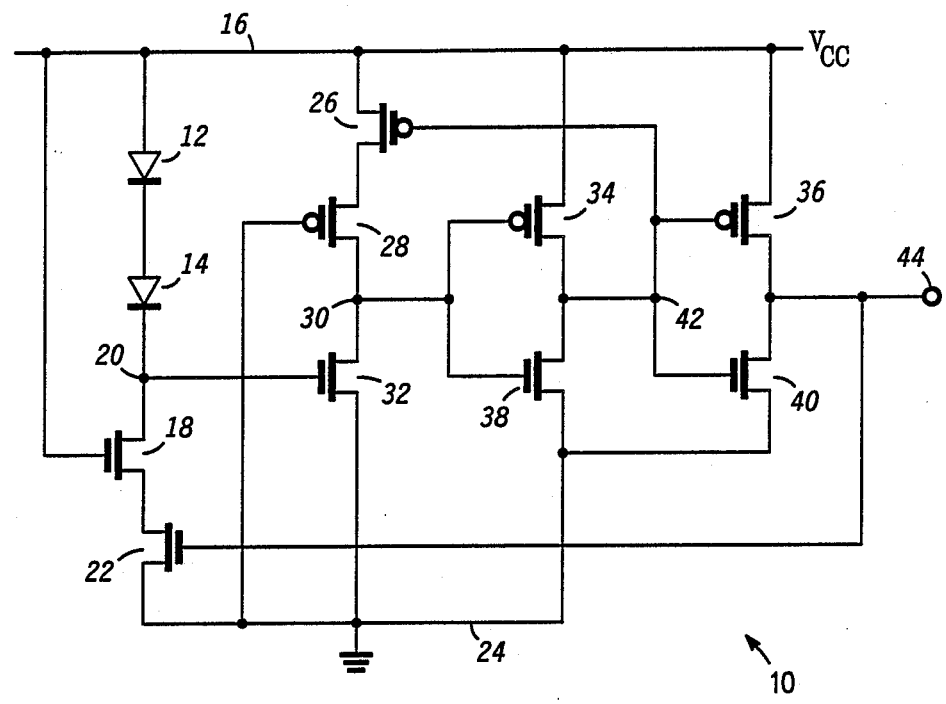
FIG. 1
FIG. 2
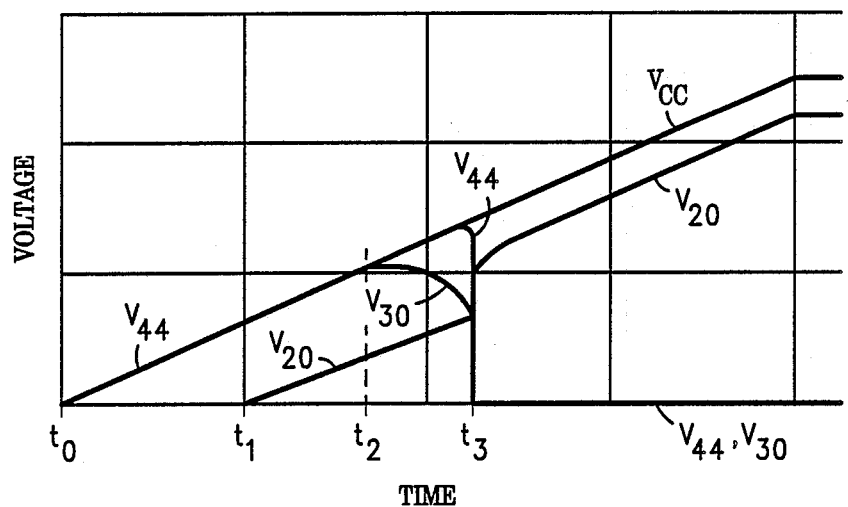

CMOS POWER-ON RESET CIRCUIT

BACKGROUND OF THE INVENTION

The present invention relates in general to power-on reset circuits, and more particularly, to a CMOS power-on reset circuit for providing an output signal during system start-up as the power supply voltage reaches a predetermined magnitude.

Power-on reset circuits are found in many applications wherein a delay is needed to provide time for the power supply voltage to ramp up to a sufficient operating level prior to the initialization of certain external circuitry. It is common to connect the output of the power-on reset circuit to the enable inputs of these external circuits to initially inhibit the operation thereof. In one example, the output signals of a clock distribution circuit are disabled at the system power-up until the power supply voltage reaches a sufficient level at which time the output clock signals are simultaneously enabled by the output signal of the power-on reset circuit to establish the correct phase relationship therebetween.

Conventional power-on reset circuits typically use a resistor and capacitor combination to introduce a time constant wherein some time is required to charge the capacitor to a predetermined voltage to trigger the output signal of the power-on reset circuit and thereby allow sufficient time for the power supply voltage to ramp up. In general, the time constant of the resistor and capacitor combination and the slew rate of the power supply voltage are not synchronized. A problem may occur if the slew rate of the power supply voltage is slow in comparison to the pre-established time constant permitting the output signal of the power-on reset circuit to enable the external circuitry before the power supply voltage reaches an operating level. Alternately, if the time constant is made extremely long, time is wasted after the power supply voltage reaches operating level until the time constant expires and the output signal of the power-on reset circuit changes state. Furthermore, conventional power-on reset circuits continue to consume power in static operation which is undesirable especially in CMOS technology.

Hence, there is a need for a power-on reset circuit operating independent of the slew rate of the power supply voltage and without a predetermined time constant to provide an output signal upon detecting a predetermined threshold of the power supply voltage start-up transient. In addition, the conduction paths through the power-on reset circuit are disabled during static operation for reducing the power consumption to substantially zero.

SUMMARY OF THE INVENTION

Accordingly, it is an objective of the present invention to provide an improved power-on reset circuit.

A further objective of the present invention is to provide an improved power-on reset circuit for providing an output signal upon detecting a predetermined threshold of the power supply voltage during system start-up.

Another objective of the present invention is to provide an improved power-on reset circuit operating independent of the slew rate of the power supply voltage.

Still another objective of the present invention is to provide an improved power-on reset circuit integrable with minimal space.

Yet another objective of the present invention is to provide an improved CMOS power-on reset circuit consuming negligible power during static operation.

In accordance with the above and other objectives there is provided a power-on reset circuit responsive to an increasing potential supplied at a first power supply conductor for providing at an output an output signal indicative of the increasing potential until reaching a predetermined threshold of the increasing potential whereat the output signal is substantially reduced, comprising a first circuit coupled to the first power supply conductor for providing the output signal which tracks the increasing potential of the first power supply conductor; second circuit responsive to the increasing potential of the first power supply conductor upon detecting the predetermined threshold thereof for inhibiting the first circuit wherein the output signal is substantially reduced; and a third circuit responsive to the reduced output signal for suppressing the current flowing through the first and second circuits.

BRIEF DESCRIPTION OF THE DRAWINGS

FIG. 1 is a schematic diagram illustrating the preferred embodiment of the present invention; and FIG. 2 is a drawing of waveforms which are useful in the description of the present invention.

DETAILED DESCRIPTION OF THE PREFERRED EMBODIMENT

Referring to FIG. 1, power-on reset circuit 10, which is suited to be manufactured in an integrated circuit form, comprises enhancement mode MOS transistors fabricated in a P-Well based CMOS process as is well understood. Power-on reset circuit comprises diodes 12 and 14 serially coupled between power supply conductor 16 and the drain of transistor 18 at node 20. The gate and source of transistor 18 are coupled to power supply conductor 16, typically operating at $V_{CC}$, and the drain of transistor 22, respectively, while the source of transistor 22 is coupled to power supply conductor 24 which typically operates at ground potential. The source of transistor 26 is coupled to power supply conductor 16, and the drain of the same is coupled to the source of transistor 28, the latter of which includes a gate coupled to power supply conductor 24 and a drain coupled at node 30 to the drain of transistor 32. The gate and source of transistor 32 are then coupled to node 20 and power supply conductor 24, respectively. The sources of transistors 34 and 36 are coupled to power supply conductor 16, and the gates of transistor 34 and 38 are coupled together to node 30. The drain of transistor 34 is coupled to the drain of transistor 38 and to the gates of transistors 26, 36 and 40 at node 42. The sources of transistors 38 and 40 are coupled to power supply conductor 24, and the drains of transistors 36 and 40 are coupled together to output 44. The gate of transistor 22 is also coupled to output 44.

The operation of power-on reset circuit 10 proceeds as follows. Starting from zero voltage at time $t_0$, FIG. 2, the power supply voltage $V_{CC}$ ramps up rendering P-channel transistors 26, 28 and 36 conductive and pulling the potentials at node 30 and output 44 up to the increasing voltage $V_{CC}$ to turn on N-channel transistors 22 and 38. The power supply voltage $V_{CC}$ continues to increase until time $t_1$ of FIG. 2 wherein diodes 12 and 14 become forward biased whereby the potential at node 20 begins to track the slew rate of voltage $V_{CC}$ with a magnitude of $V_{CC} - V_{12} - V_{14}$, where $V_{12}$ and $V_{14}$ are the potentials across diodes 12 and 14, respectively. The conduction path through transistor 18 is then enabled through transistor 22 to power supply conductor 24. At time $t_2$, the potential developed at node 20, $V_{20}$, reaches the gate-source voltage necessary to turn on transistor 32. The gate length of transistor 32 is sized to have a greater drive capacity than transistor 28, hence, the voltage at node 30, $V_{30}$, begins to fall as shown in FIG. 2. When voltage $V_{30}$ falls to the transition threshold of the inverter formed through transistors 34 and 38 at time $t_3$, transistor 38 turns off and transistor 34 turns on forcing the voltage at node 42 high to turn off transistor 36 and turn on transistor 40. The threshold of the inverter (34, 38) is typically made less than $V_{CC}/2$ to extend the time interval between time $t_2$ and $t_3$. The voltage at output 44, $V_{44}$, falls rapidly providing the output signal of power-on reset circuit 10 signifying to the external circuitry connected thereto that power supply voltage $V_{CC}$ has reached a sufficient potential to commence operation. Meanwhile, the sharp transition of voltage $V_{44}$ also turns off transistor 22 disabling the conduction path through diodes 12 and 14 and transistor 18, and the high potential of voltage $V_{42}$ turns off transistor 26 inhibiting the conduction path through transistors 28 and 32 such that substantially zero power is consumed during static operation. The output signal of power-on reset circuit 10 changes state at a predetermined threshold of the power supply voltage independent of the slew rate thereof. It should be appreciated by now that the slew rate of the power supply voltage is irrelevant.

The output of power-on reset circuit 10 is typically coupled to the enabled inputs of external circuitry. For example, the output signals of a clock distribution circuit may be disabled at the system power-up until the power supply voltage reaches a sufficient level at which time the output clock signals are simultaneously enabled at the change of state of the output signal of the power-on reset circuit to establish the correct phase relationship therebetween.

The predetermined threshold of the power supply voltage may be adjusted through the gate-source potentials of transistors 34 and 38 and, to a lesser extent, through the gate length of transistor 18. For example, the threshold of voltage $V_{CC}$ may be increased by enlarging the ratio of the gate width of transistor 38 to the gate width of transistor 34 which provides a higher turn on threshold for transistor 38 and, correspondingly, a greater value of $V_{CC}$ to transition the output signal. Alternately, the gate width of transistor 18 may be increased to conduct additional current therethrough and increase the potential developed across diodes 12 and 14 to increase the value of $V_{CC}$ at which the output signal transitions low.

Hence, what has been provided is a novel power-on reset circuit that changes the state of the output signal at a predetermined threshold of the power supply voltage independent of the slew rate of the start-up transient while achieving substantially zero steady state current flow.

We claim:

1. A circuit responsive to an increasing potential supplied at a first power supply conductor for providing at an output an output signal indicative of the increasing potential until reaching a predetermined threshold of the increasing potential whereat the output signal is substantially reduced, comprising:

first means coupled to the first power supply conductor for providing the output signal which tracks the increasing potential of the first power supply conductor;

second means responsive to the increasing potential of the first power supply conductor upon detecting the predetermined threshold thereof for inhibiting said first means such that the output signal is substantially reduced; and third means responsive to the reduced output signal for suppressing the current flowing through first and second means.

2. The circuit of claim 1 wherein said second means comprises:

a first transistor having a gate, a drain and a source, said gate being coupled to the first power supply conductor, said source being coupled to a second power supply conductor;

at least one diode means serially coupled between the first power supply conductor and said drain of said first transistor; and a second transistor having a gate, a drain and a source, said gate being coupled to said drain of said first transistor, said source being coupled to said second power supply conductor, said drain being coupled to the output.

3. The circuit of claim 2 wherein said first means comprises a third transistor having a gate, a drain and a source, said gate being coupled to said second power supply conductor, said drain being coupled to said drain of said second transistor, said source being coupled to the first power supply conductor.

4. The circuit of claim 3 wherein said third means comprises a fourth transistor having a gate, a drain and a source, said drain being coupled to said source of said third transistor, said source being coupled to the first power supply conductor.

5. The circuit of claim 4 wherein said third means further comprises a fifth transistor having a gate, a drain and a source, said gate being coupled to the output, said drain being coupled to said source of said first transistor, said source being coupled to said second power supply conductor.

6. The circuit of claim 5 wherein said first means further comprises a driver circuit coupled between said drain of said second transistor and the output.

7. The circuit of claim 6 wherein said driver circuit comprises a first inverter having an input coupled to said drain of said second transistor and having an output.

8. The circuit of claim 7 wherein said driver circuit further comprises a second inverter having an input coupled to said output of said first inverter and having an output coupled to the output.

9. The circuit of claim 8 wherein said first inverter comprises:

a sixth transistor having a gate, a drain and a source, said gate being coupled to said input of said first inverter, said drain being coupled to said output of said first inverter, said source being coupled to the first power supply conductor; and a seventh transistor having a gate, a drain and a source, said gate being coupled to said input of said first inverter, said drain being coupled to said output of said first inverter, said source being coupled to said second power supply conductor.

10. The circuit of claim 9 wherein said second inverter comprises:

an eighth transistor having a gate, a drain and a source, said gate being coupled to said input of said second inverter, said drain being coupled to said output of said second inverter, said source being coupled to the first power supply conductor; and a ninth transistor having a gate, a drain and a source, said gate being coupled to said input of said second inverter, said drain being coupled to said output of said second inverter, said source being coupled to said second power supply conductor.

11. A circuit having an output for providing an output signal in response to the power-on transient of a first power supply conductor wherein the output signal changes state at a predetermined threshold of the potential developed at the first power supply conductor independent of the slew rate thereof, comprising:

a first transistor having a drain, a source and a gate coupled to the first power supply conductor;

at least one diode means serially coupled between the first power supply conductor and said drain of said first transistor;

a second transistor having a gate, a drain and a source, said gate being coupled to said drain of said first transistor, said source being coupled to a second power supply conductor, said drain being coupled to the output;

a third transistor having a gate, a drain and a source, said gate being coupled to said second power supply conductor, said drain being coupled to said drain of said second transistor;

a fourth transistor having a gate, a drain and a source, said drain being coupled to said source of said third transistor, said source being coupled to the first power supply conductor; and a fifth transistor having a gate, a drain and a source, said gate being coupled to the output, said drain being coupled to said source of said first transistor, said source being coupled to said second power supply conductor.

12. The circuit of claim 11 further comprising a driver circuit coupled between said drain of said second transistor and the output.

13. The circuit of claim 12 wherein said driver circuit comprises a first inverter having an input coupled to said drain of said second transistor and having an output.

14. The circuit of claim 13 wherein said driver circuit further comprises a second inverter having an input coupled to said output of said first inverter and having an output coupled to the output.

15. The circuit of claim 14 wherein said first inverter comprises:

a sixth transistor having a gate, a drain and a source, said gate being coupled to said input of said first inverter, said drain being coupled to said output of said first inverter, said source being coupled to the first power supply conductor; and a seventh transistor having a gate, a drain and a source, said gate being coupled to said input of said first inverter, said drain being coupled to said output of said first inverter, said source being coupled to said second power supply conductor.

16. The circuit of claim 15 wherein said second inverter comprises:

an eighth transistor having a gate, a drain and a source, said gate being coupled to said input of said second inverter, said drain being coupled to said output of said second inverter, said source being coupled to the first power supplu conductor; and an ninth transistor having a gate, a drain and a source, said gate being coupled to said input of said second inverter, said drain being coupled to said output of said second inverter, said source being coupled to said second power supply conductor.

17. An integrated circuit having an output for providing an output signal in response to the power-on transient of a first power supply conductor wherein the output signal changes state at a predetermined threshold of the potential developed at the first power supply conductor independent of the slew rate thereof, comprising:

a first transistor having a drain, a source and a gate coupled to the first power supply conductor;

at least one diode means serially coupled between the first power supply conductor and said drain of said first transistor;

a second transistor having a gate, a drain and a source, said gate being coupled to said drain of said first transistor, said source being coupled to a second power supply conductor, said drain being coupled to the output;

a third transistor having a gate, a drain and a source, said gate being coupled to said second power supply conductor, said drain being coupled to said drain of said second transistor;

a fourth transistor having a gate, a drain and a source, said drain being coupled to said source of said third transistor, said source being coupled to the first power supply conductor; and a fifth transistor having a gate, a drain and a source, said gate being coupled to the output, said drain being coupled to said source of said first transistor, said source being coupled to said second power supply conductor.

18. The method of detecting a predetermined threshold of an increasing potential supplied at a power supply conductor during power-on and providing an output signal in response thereto, comprising the steps of:

establishing an output signal which tracks the increasing potential supplied at the power supply conductor;

developing a control signal having a slew rate substantially equal to the slew rate of the increasing potential of the power supply conductor as the increasing potential of the power supply conductor reaches a first predetermined level;

reducing the output signal upon detecting a predetermined level of said control signal corresponding to a second predetermined level of the increasing potential of the power supply conductor; and disabling the current flow upon detecting the reduction of the output signal.

* * * * *